United States Patent
Pio et al.

(10) Patent No.: US 6,535,431 B1
(45) Date of Patent: Mar. 18, 2003

(54) METHOD OF ADJUSTING PROGRAM VOLTAGE IN NON-VOLATILE MEMORIES, AND PROCESS FOR FABRICATING A NON-VOLATILE MEMORY DEVICE

(75) Inventors: Federico Pio, Brugherio (IT); Enrico Gomiero, Padua (IT); Paola Zuliani, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/552,933

(22) Filed: Apr. 20, 2000

(30) Foreign Application Priority Data

Apr. 21, 1999 (EP) .............................................. 99830235

(51) Int. Cl.$^7$ .............................................. G11C 16/04
(52) U.S. Cl. ............................ 365/185.24; 365/185.03; 365/189.09
(58) Field of Search ....................... 365/185.24, 189.09, 365/185.03, 185.18

(56) References Cited

U.S. PATENT DOCUMENTS

| | | | |
|---|---|---|---|
| 5,053,990 A | * 10/1991 | Kreifels et al. | ............. 711/103 |
| 5,204,839 A | * 4/1993 | Lee et al. | .................... 365/204 |
| 5,703,807 A | 12/1997 | Smayling et al. | ...... 365/185.03 |
| 5,721,704 A | * 2/1998 | Morton | .................. 365/185.23 |
| 5,828,607 A | 10/1998 | Bushey et al. | ......... 365/189.11 |

FOREIGN PATENT DOCUMENTS

| EP | 0375274 A1 | 6/1990 |
|---|---|---|
| EP | 0802540 A2 | 10/1997 |

* cited by examiner

Primary Examiner—Vu A. Le
(74) Attorney, Agent, or Firm—Lisa K. Jorgenson; Dennis M. de Guzman; Seed IP Law Group PLLC

(57) ABSTRACT

The invention relates to a method of adjusting the erase/program voltage in semiconductor non-volatile memories. The memories are formed of at least one matrix of memory cells having a floating gate, a control gate, and drain and source terminals, and are organized by the byte in rows and columns, each byte comprising a group of cells having respective control gates connected in parallel with one another to a common control line through a selection element of the byte switch type, and each cell being connected to a respective control column through a selection element of the bit switch type. Advantageously, a double adjustment is provided for the program voltage of the memory cells, whereby the program voltage during the erasing phase can be higher in modulo than the program voltage during the writing phase. This is achieved by providing respective adjusters connected between a program voltage generator and the cell matrix, or alternatively forming the bit switch element inside a well and the byte switch element directly in the substrate.

15 Claims, 5 Drawing Sheets

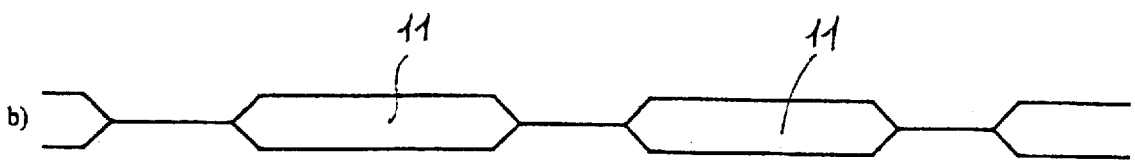
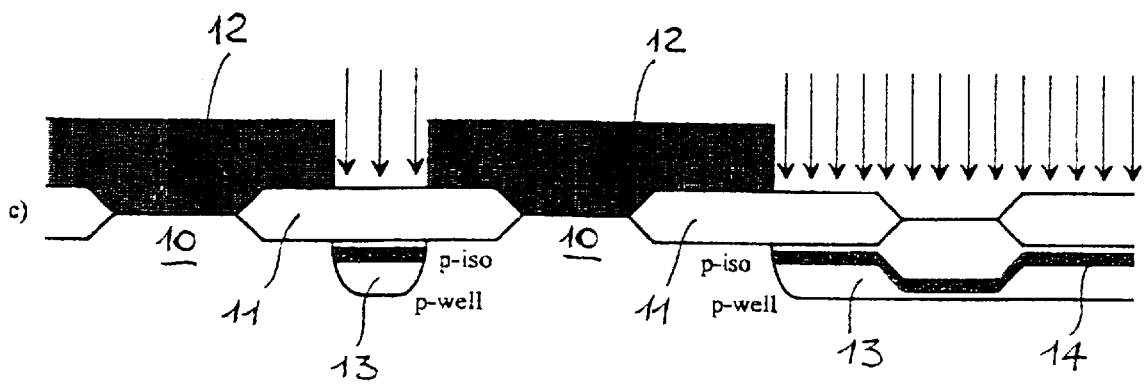
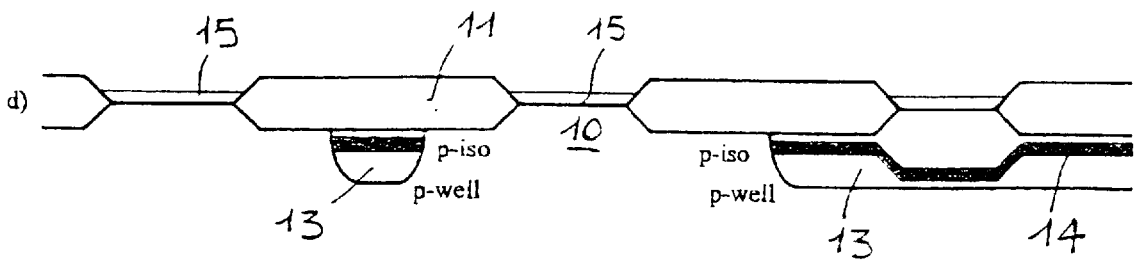
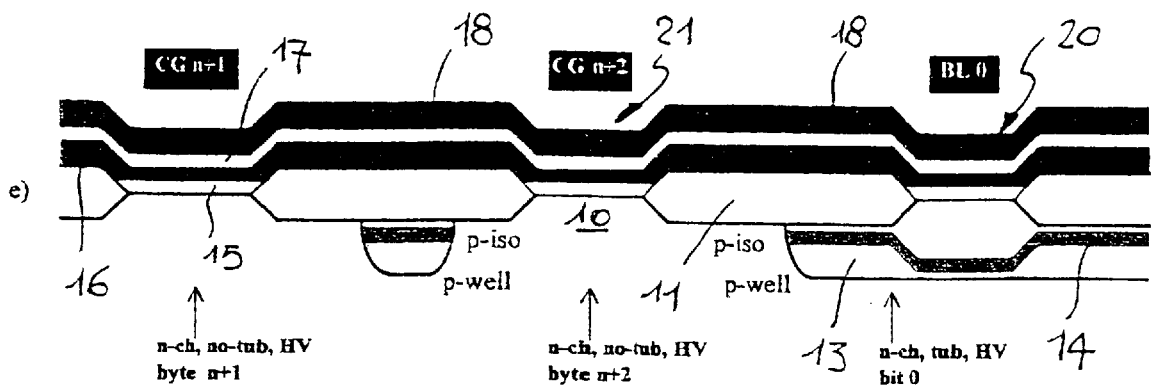

METHOD OF ADJUSTING PROGRAM VOLTAGE IN NON-VOLATILE MEMORIES, AND PROCESS FOR FABRICATING A NON-VOLATILE MEMORY DEVICE

TECHNICAL FIELD

This invention relates to a method of adjusting the erase/program voltage in semiconductor non-volatile memories.

BACKGROUND OF THE INVENTION

In a NORed non-volatile memory, e.g., of the EEPROM type, the matrix of elementary cells is organized by the memory word, i.e., by the byte, in accordance with a known circuit diagram shown in FIG. 1.

FIG. 2 shows to an enlarged scale the layout of a portion of the non-volatile memory of the EEPROM type.

Each byte forms a memory word and comprises a series of at least eight floating gate transistors, each connected in series to a respective selection transistor (bit switch) on a common bit line of the cell matrix.

Each floating gate transistor has a control gate capacitively coupled to the floating gate, and the control gates of the eight memory cells making up the byte are connected in parallel with one another by a common polysilicon connection. These control gates are also connected to a metallization line CG through a byte switch.

The gates of the byte switch and the 8 bit switches (more generally, all the switches on the same word line) are connected in parallel with one another by a polysilicon connection.

The erase operation is typically performed by the byte, by addressing the m-th word line (WL), corresponding to the m-th matrix row, and the n-th control gate (CG), corresponding to the n-th byte column.

The byte switch is operated by applying an elevated voltage (e.g., of 16V) to the m-th word line WL, so that an erase voltage can be transferred which is supplied on an n-th metallization line CG to the control gate of the desired byte transistors. In this way, electrons are injected into the floating gate, by a phenomenon known as Fowler-Nordheim tunnelling, to raise the threshold voltage for each bit.

The writing of individual bits, within a byte, is effected by addressing the respective word line WL (which may be biased to 16V, for example, with all the other word lines being at a ground potential), and applying a write voltage Vpp to a node BL k. The node is allowed to float according to whether the bit is to be written or held in an erased state. The write voltage applied to the node BL k is transferred to the drain terminal of the floating gate transistor (i.e., to the memory cell) by means of the selection transistor or bit switch, thereby depleting the floating gate of electrons and lowering the threshold voltage of the memory cell.

The cell content is read by biasing the m-th word line WL of the selected matrix row to a suitable voltage, addressing the n-th column CG (as biased to an intermediate voltage to the threshold values of the written and the erased cells), and applying a read voltage to the node BL k. By measuring the current drawn through the bit line, the charged state of the floating gate, drawing a larger or lesser amount of current according to whether it is negative or positive, can be found.

The write/erase voltage is generated and adjusted within the memory device itself. Thus, a single adjustment for both operations is desirable, as shown in the block diagram of FIG. 3.

A variation $\Delta Vt$ occurs in the threshold voltage with respect to a value $Vt^{U-V}$, which corresponds to absence of charge in the floating gate, according to either of two states: erased or written. This voltage variation is tied to the injection current F-N, given by the following relation:

$$\Delta V_t = \frac{1}{C}\int_0^{T_P} I_{FN}(E_{ox}(t))dt \quad (1)$$

The current F-N is, in turn, dependent on the electric field across the tunnel oxide of the memory cell; this electric field is given approximately by relation (2) below.

$$|E_{ox}(t)| \sim \frac{|V_{FG}(t) - V_D|}{T_{ox}} \quad (2)$$

where, $$V_{FG}(t) = \alpha_G V_G(t) + \alpha_S V_{S+\alpha D} V_D(t) + \alpha_B V_B + Q_{FG}(t)/C_{tot} \quad (3)$$

and $\alpha_G$, $\alpha_S$, $\alpha_D$, $\alpha_B$ are the gate, source, drain, and body capacitive coupling coefficients, respectively.

These values are given as $\alpha i = C i / C_{tot}$, where Ci is the capacitance between the floating gate and the corresponding i-th region, and $C_{tot} = \Sigma i\, C i$, as shown schematically in FIG. 4.

During the erasing phase, the one voltage other than zero is the voltage applied to the control gate, and during the writing phase, the one non-zero voltage is that applied to the drain terminal. Thus (neglecting the floating gate variation in charged state), it is:

$$|E^E ox| \, \alpha_G \cdot V_{PP}(CG)$$

and $$|E^W ox| \, (1-\alpha_D) \cdot V_{PP}(D)$$

Since relation $\alpha_G \approx 1-\alpha_D$ is true (it being $\alpha_S$, $\alpha_B \ll 1$), it can be stated that:

$$|E^E ox| \approx |E^W ox| \text{ if } Vpp(CG) = Vpp(D).$$

In the most advanced of semiconductor integrated memory device fabrication processes, the doping of the polysilicon layer that forms the memory cell floating gate cannot be a heavy one, because CVD depositions with in situ doping are typically used and the equipment has limitations as regards control of the deposition process and the throughput phenomenon. In fact, the heavier the doping, the slower becomes the deposition, which obviously affects fabrication costs.

In addition, increasing the floating gate doping, such as by using known ion implantation techniques, is impracticable because it would affect the quality of the tunnel oxide significantly, also on account of the doping profile unavoidably exhibiting ion "tails" which would extend to the thin oxide and the substrate.

With too light a floating gate doping, a voltage loss may be incurred due to the floating gate depletion phenomenon during the erasing phase (Vcg=Vpp>>0), which would reflect in a lower effective electric field across the tunnel oxide than during the writing phase, and accordingly, in a threshold variation $|\Delta Vt^E| < |\Delta Vt^W|$.

It will be appreciated that this effect is highly undesirable, because the difference in the threshold voltage of a virgin cell, being used as a reference cell in sense amplifiers, and the corresponding voltage at the two logic states is not the same. In other words, the voltage $Vt^E$ does not split the total threshold variation.

In order to achieve a sufficient threshold variation of the erased cells compared to the virgin cell, the program voltage Vpp could be increased; however, this would not solve the problem of making the two different threshold voltages of the cell symmetrical, and moreover, would bring about writing conditions which are more stressing than is strictly necessary.

In fact, an injection of electrons from the floating gate into the substrate is specially critical to the thin oxide due to the peculiar nature of the polysilicon/dielectric interface. Furthermore, a possible generation of charges, following deflection of the bands near the N+/Psub junction and known as band-to-band tunnelling, can impair the device reliability.

Another problem is that the bit switch is to ensure lockout of the non-addressed memory cells on the same bit line during the reading phase, and is additionally used for transferring the program voltage Vpp to the cell drain during the writing phase.

To meet this requirement, it could be considered of increasing the threshold voltage Vt of the bit switch, such as by means of a dedicated LVS implant. But this would involve increased manufacturing costs because an additional mask would become necessary in the fabrication process flow.

SUMMARY OF THE INVENTION

Embodiments of this invention provide a method of adjusting the erase/program voltage in non-volatile memories, such that the two variations in the cell threshold voltage can be rendered symmetrical, thereby overcoming the aforementioned drawbacks of the prior art. In adjusting the erase/program voltage, a double adjustment is performed, whereby the program voltage can be higher during the erasing phase than during the writing phase.

Therefore, presented is a method of adjusting the program voltage in semiconductor non-volatile memories that include memory cells having a floating gate, a control gate, and drain and source terminals, and are organized by the byte in rows and columns. Each byte includes a group of cells having respective control gates connected in parallel with one another to a common control line through a byte switch selection element, and each cell is connected to a respective control column through a bit switch selection element. The method provides for a double adjustment of the program voltage of the memory cells, whereby the program voltage during the erasing phase can be higher in modulo than the program voltage during the writing phase. In this way, the floating gate depletion during the erasing phase can be accommodated.

In another embodiment, a device for adjusting the programming voltage in semiconductor non-volatile memories is provided including a bit switch selection element that connects a cell to a respective control column, the bit switch being formed inside a well.

The features and advantages of the method of this invention will become apparent from the following description of an embodiment thereof, given by way of non-limitative example with reference to the accompanying drawings.

BRIEF DESCRIPTION OF THE DRAWINGS

FIGS. 6a, 6b, 6c, 6d and 6e are vertical cross-sectional views taken parallel to the word lines WL, showing a portion of a semiconductor substrate subjected to a sequence of processing steps for making an electronic non-volatile memory device according to an embodiment of the invention.

DETAILED DESCRIPTION OF THE INVENTION

Figure 1:
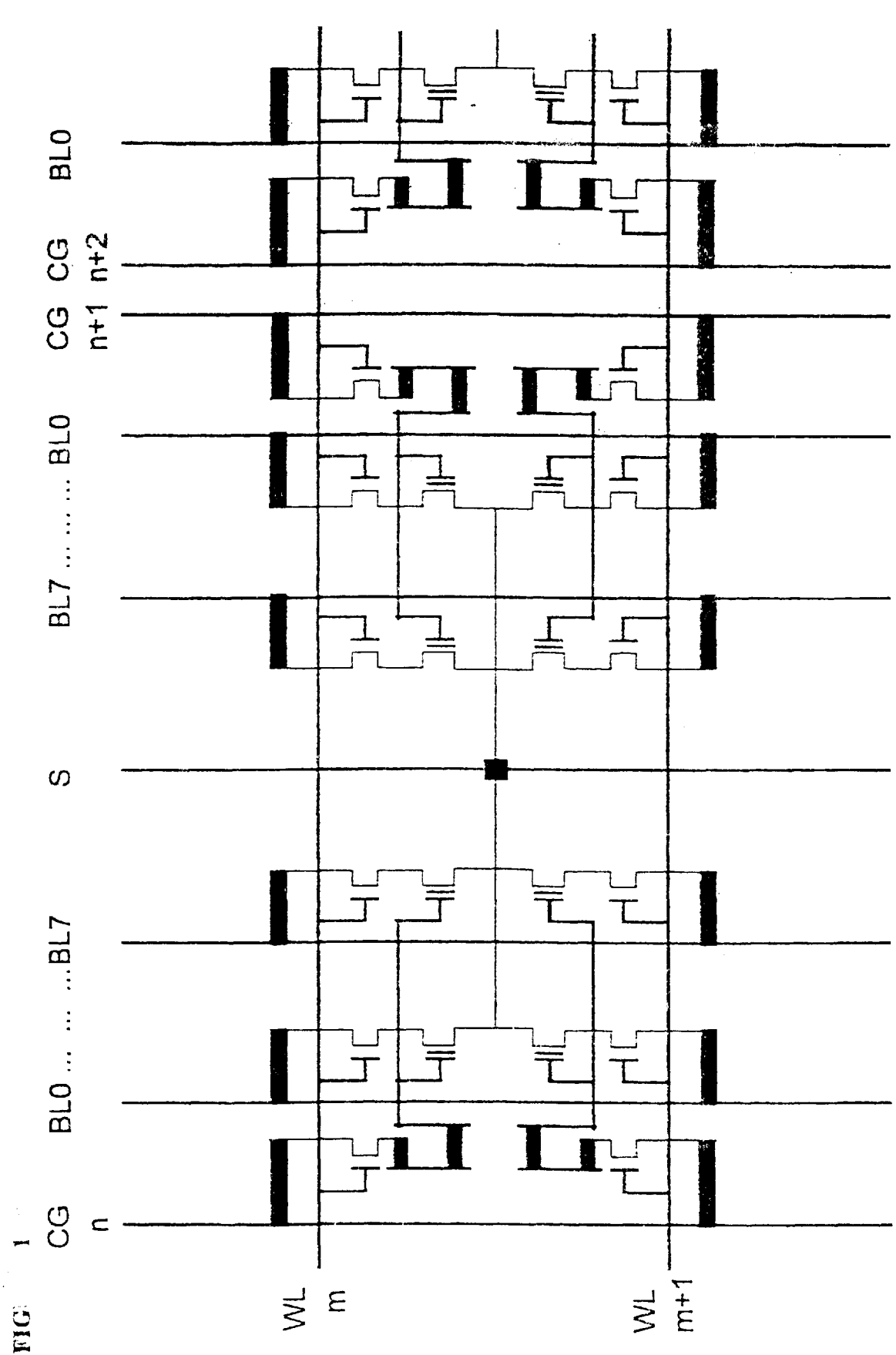
FIG. 1 is a circuit diagram of a conventional non-volatile memory matrix organized by the word.
Figure 2:
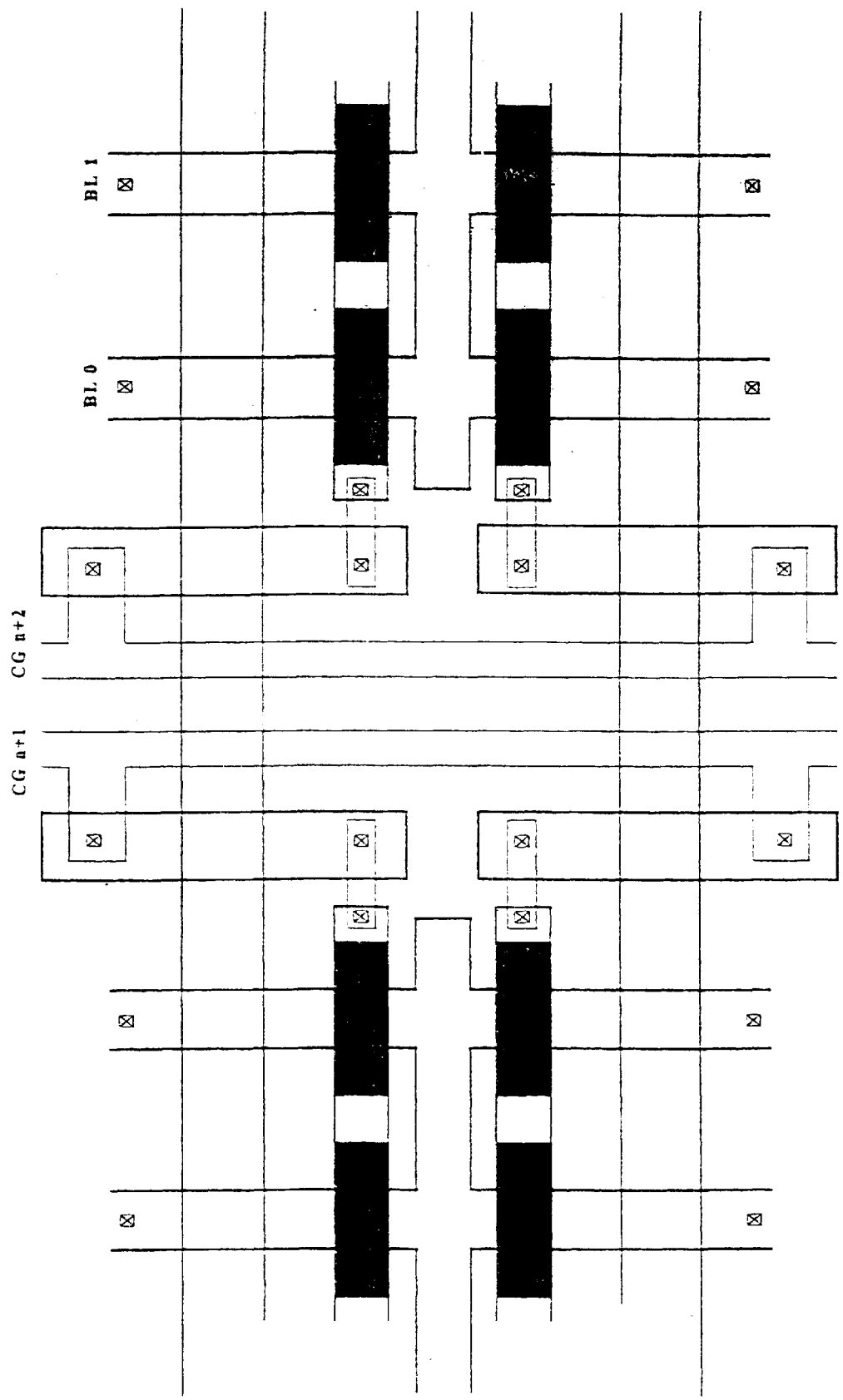
FIG. 2 is a top plan view of a portion of the layout of the memory matrix shown in FIG. 1.
Figure 3:
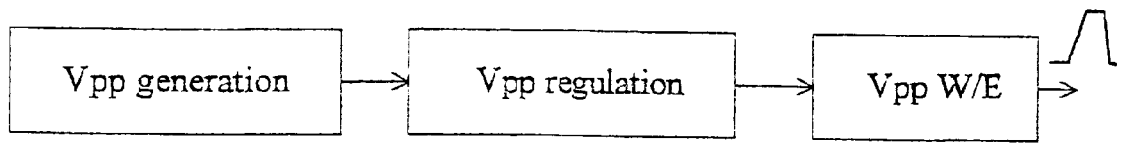
FIG. 3 is a block representation of the adjustment flow for a program voltage within an electronic non-volatile memory device.
Figure 4:
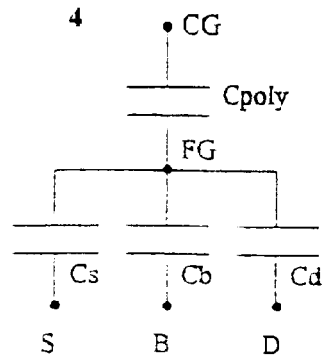
FIG. 4 is a schematic drawing illustrating the capacitive couplings between the terminals of an elementary non-volatile memory cell.
Figure 5:
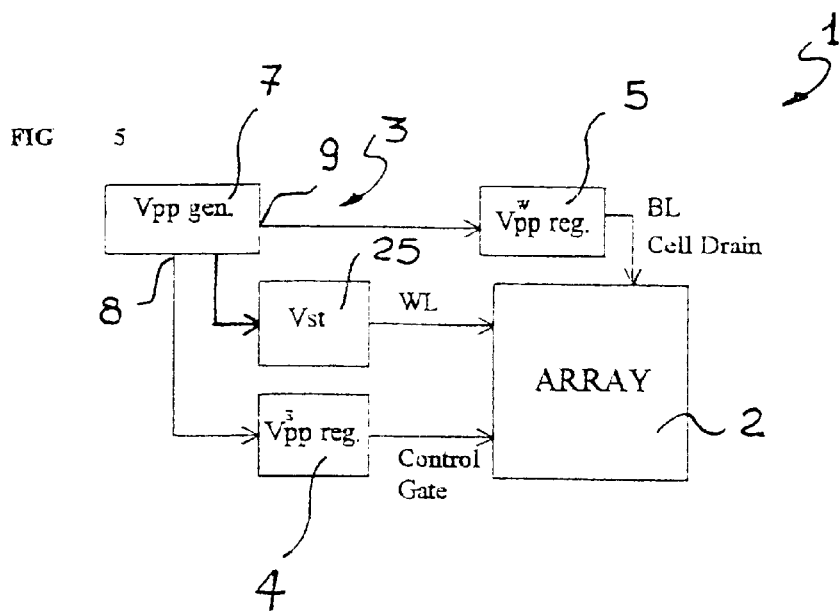
FIG. 5 is a schematic diagram showing an electronic non-volatile memory device which incorporates a circuit for adjusting the programming voltage according to an embodiment of the invention.

Referring to the drawing views generally, and specifically to the example shown in FIG. 5, a portion of a non-volatile memory device integrated monolithically in a semiconductor, e.g., a non-volatile memory of the EEPROM type, is generally shown at 1.

The device portion 1 includes a matrix 2 of memory cells, each consisting of a floating gate transistor having source and drain terminals, and a control gate terminal. The control gate is capacitively coupled to the floating gate.

The cell matrix 2 conventionally comprises a plurality of rows, referred to as the word lines WL, and a plurality of columns, referred to as the bit lines BL.

Each memory cell is defined by the intersection of a row and a column in the matrix 2. An adjuster 25 of the voltage Vst applied to the matrix rows WL is shown in FIG. 5.

The portion 1 of the memory device further includes control circuitry 3 for the cell matrix 2. This circuitry 3 includes a generator 7 for a program voltage Vpp.

Advantageously in this embodiment, the circuitry 3 also includes a first adjuster 4 of an erase voltage VppE and a second adjuster 5 of a write voltage VppW.

The first adjuster 4 is connected between an output 8 of the generator 7 and the matrix 2 rows. The second adjuster 5 is connected between a second output 9 of the generator 7 and the matrix 2 columns.

The adjusters 4 and 5 function as adjustment and control circuits for the program voltage Vpp from the generator 7.

In this way, it becomes possible to substantially unbalance the program window $|\Delta Vt^E|$ and/or $|\Delta Vt^W|$ as required, using a higher erase voltage than the write voltage: $|Vpp^E| \geq |Vpp^W|$.

This is specially advantageous since, during the erasing phase, inherently less damage is produced than during the writing phase, for a given value of the voltage Vpp. Thus, it becomes possible to maintain an adequate total threshold variation by reducing the write voltage VppW.

In addition, this solution allows the erase pulse to be fully cleared from the write pulse, also as regards the pulse duration and the ramp rate, as well as the signal amplitude.

The improvement in reliability of an EEPROM cell brought about by this invention is especially profound for "multi-level" applications, where a single floating gate transistor stores two or more logic values and it is therefore necessary to keep the corresponding threshold values Vt well apart throughout the device life span.

In accord with the embodiment just described, an alternative embodiment of this invention will now be described.

This alternative embodiment provides for a suitable construction of the transistors which form the selection elements of the bit switch and byte switch types.

The highest voltage Vpp that can be transferred from the drain terminal to the source terminal of the byte switch is tied to its threshold voltage (and associated body effect) and gate voltage by the following relation:

$$Vpp_{max} = VG(\text{byte switch/bit switch}) - Vt(\text{with body})$$

This embodiment of the invention proposes of differentiating the two switch transistors, namely the byte and bit switches, to optimize the characteristics of the threshold voltage in connection with the functions that they are to provide individually.

Favored in the byte switch is ease of transmission of the program voltage Vpp applied to the CG line for a given voltage placed on the switch gate. In particular, this transistor is formed with a low threshold voltage value and a small body effect coefficient Kbe.

On the other hand, of specific interest in the bit switch, which is connected in series to the memory cell, is to have any undesired (leakage) current paths cut off when the corresponding cell is not addressed during the reading phase. In this case, forming this selection transistor with a relatively high threshold voltage value, different from that of the byte switch, is beneficial.

Furthermore, the device reliability can be improved by transferring the voltage $Vpp_{max}$ to the EEPROM cell during the writing phase (where the voltage Vpp is applied to the drain of the bit switch in series with the cell on the same bit line) at a lower value than the voltage transferred to the control gate during the erasing phase, since a larger voltage drop will occur due to the elevated threshold and the body effect of this transistor be higher.

The embodiment provides, as explained hereinafter, the improvements sought without requiring any additional masks in the fabrication process.

Specifically with reference to the examples of FIGS. 6a to 6e, those steps of the manufacturing process closely related to this embodiment of the invention will now be described.

The process steps and the structures described herein below do not form a complete process flow for the fabrication of integrated circuits. In fact, this invention can be practiced in combination with integrated circuit fabrication techniques currently employed in the industry, and only such process steps as are necessary to an understanding of this invention will be described. Discussion of processes or structures well known to those skilled in the art has been abbreviated or eliminated for brevity.

Figures showing cross-sectional views of portions of an integrated circuit during its fabrication are not drawn to scale but rather to highlight features of the description.

Illustrated schematically in FIG. 6a is a step of defining active areas 10 in a semiconductor substrate which are separated from one another by field oxide regions 11 (FIG. 6b).

At this stage, a masking step 12 is carried out to form P-well 13 and isolation 14 regions. In particular, the following process steps are carried out using the mask 12: a first implantation of the p type, at a high energy, to form the P-well regions 13; a second implantation, at a lower energy, to form isolation or P-iso regions 14 having the same type of dopant; and an optional third implantation of the p type, at a low energy, for adjusting the transistor thresholds.

The selection transistor or bit switch is formed in the P-well 13, and receives therefore the above implants; the byte switch is instead screened off by a resist layer during the above implanting steps, and accordingly, receives no implant and retains the substrate doping.

A cross-section resulting from these implantations is shown schematically in FIG. 6c.

At this stage, a gate oxide layer 15 of, for instance, the high-voltage type is grown in order to accommodate the high program voltages. This is followed by the steps of: depositing a first polysilicon layer 16, or Poly 1, and defining the floating gates of the memory cells; growing a dielectric layer 17 of interpoly (e.g., ONO); depositing a second polysilicon layer 18 (Poly 2), and optionally forming a silicide layer to lower the resistivity of the Poly 2 lines; and then defining a ply structure or stack comprising the Poly 2 layer 18, ONO layer 17 and Poly layer 16 by self-aligned etching.

The process is then completed conventionally by N and P implantations of the LDD type, the formation of spacers, source and drain N+/ P+ implantations, the deposition of an intermediate dielectric, the formation of contacts and metal interconnections, etc.

Shown in FIG. 6e is the semiconductor portion at the finish of these process steps. Also shown are three metallization lines, two for delivering the control gate signals CG to the matrix, and one for the bit line signal BL.

For the sake of completeness, the Poly 1 and Poly 2 lines of the matrix transistors are separated by the ONO layer, and are shorted by a conventional process, known as of the double-shorted poly, for removing the ONO before depositing the Poly 2, where Poly 1 and Poly 2 are to be connected.

It can be seen, from the sectional view of FIG. 6e, that an N-channel HV bit switch transistor 20 has been provided inside the P-well 13. This means that the transistor 20 has a higher surface dopant concentration and, therefore, a higher threshold voltage Vt and higher body effect coefficient Kbe.

Furthermore, this process yields an N-channel HV byte switch transistor 21 outside the P-well 13 having, therefore, a lower surface dopant concentration, that is a lower threshold voltage Vt and lower body effect Kbe.

The formation of the two types of transistors 20, 21 involves no additional masks, since the P-well, P-iso mask already exists in the process and, in particular, protects the N-well regions.

The embodiment described hereinabove affords a number of advantages. First, no difficulty is encountered in transferring the program voltage VppE for erasing to the control gate CG of the memory cell, since the threshold of the byte switch, and with it the coefficient Kbe, is quite low because it is determined by the substrate doping. It will be sufficient that byte selection voltages Vg be generated at a smaller value than in conventional solutions. No problems are encountered with reading, since the byte switch has a high threshold and cuts off any unwanted current paths along the addressed bit line, but on different word lines. No control gate perturbation occurs because, despite a low body effect factor, the highest voltage attained by the GC of the memory cell (i.e., the source of the byte switch) is on the order of one hundred mV and can rise no further, since Vgs<0 will turn off the transistor. A single adjustment of the program voltage Vpp can be used to obtain two different voltages for the cell erasing and writing.

Figure 7:
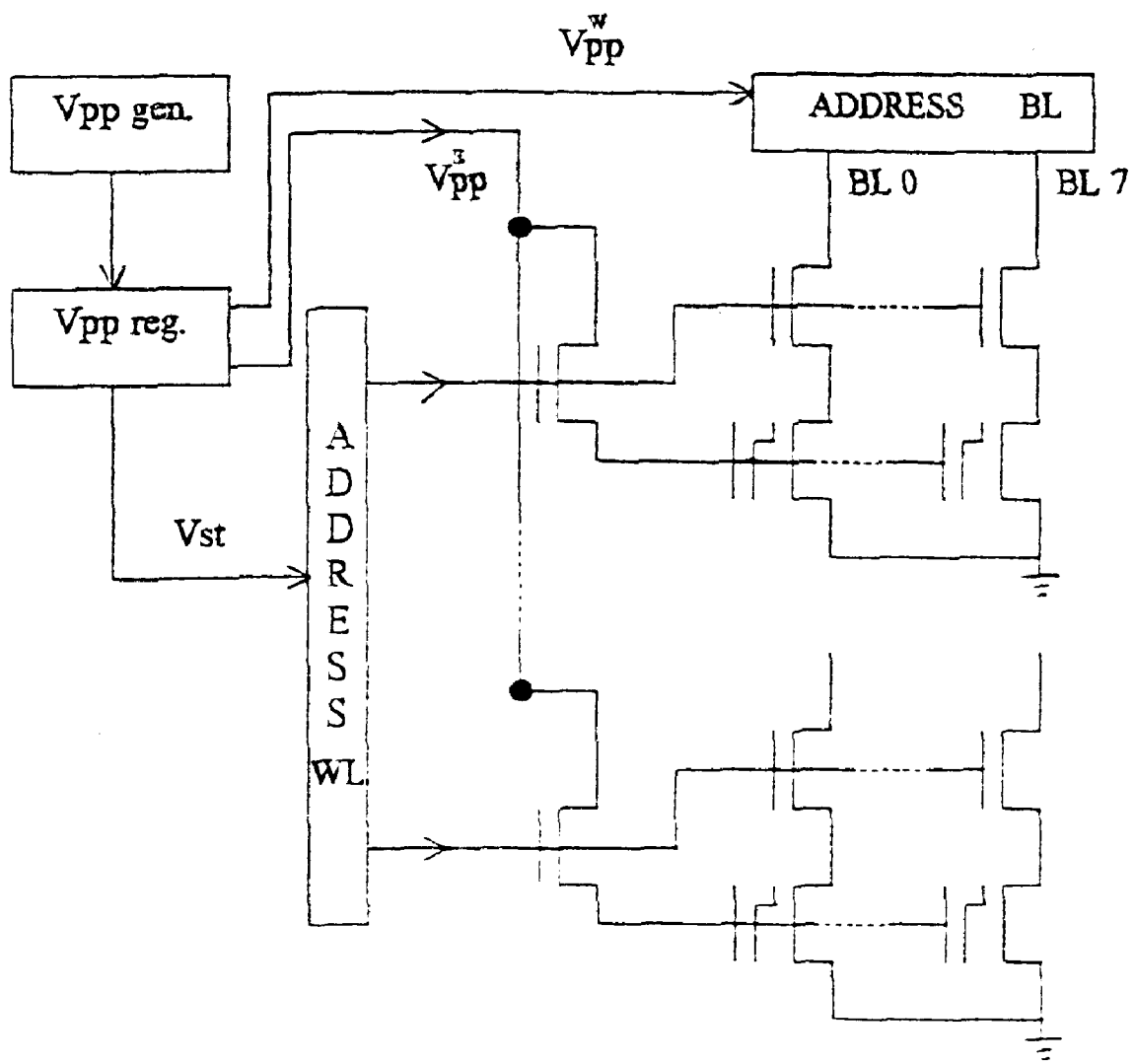
FIG. 7 is a schematic diagram illustrating a detail of the circuitry shown in FIG. 5.

In this respect, reference is made to the example of FIG. 7, where the circuit construction of FIG. 5 can be seen in greater detail.

By having different threshold voltages for the two switches (bit switch and byte switch), for a given select voltage Vg applied to their gates and given voltage Vpp applied to their drains according to the type of the operation being executed, either writing or erasing, the voltage actually transmitted to the respective sources are different.

More particularly, the effective erase voltage will be higher than the write voltage, as is in fact desired to accommodate the Poly 1 depletion.

Among further advantages, this solution can be implemented with no additional masks.

To raise the threshold voltage of the parasitic transistor existing between consecutive bytes along the same word line, it will be sufficient to also perform the P-well and P-iso implantations as thin strips between the two transistors (see FIGS. 6c and 6e). By so doing, in fact, the dopant concentration under the field oxide is increased, especially by virtue of the P-iso implantation being carried out at a suitable energy to maximize the doping profile at that location for this very purpose.

It should be further noted that the same advantages can be also secured in the instance of EEPROMs having a single polysilicon layer, by forming the byte and bit switches differently (for instance outside and inside the P-wells as described hereinabove).

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A method of adjusting a program voltage in semiconductor non-volatile memories comprising at least one matrix of memory cells each having a floating gate, a control gate, and drain and source terminals, the memory cells being organized by bytes in rows and columns, each byte having a group of cells having respective control gates connected in parallel with one another to a common control line through a byte switch selection element, and each cell of the group being connected to a respective control column through a bit switch selection element, the method comprising:

adjusting the program voltage of each of the memory cells in at least one group of cells to a first level during an erasing phase; and adjusting the program voltage of each of the memory cells in the at least one group of cells to a second level different from the first level, during a writing phase.

2. The method according to claim 1 wherein adjusting the program voltages comprises operating respective adjusters connected between a program voltage generator and the cell matrix.

3. The method according to claim 1 wherein the programming voltage during the erasing phase has a duration, ramp rate, and signal amplitude independent of the programming voltage during the writing phase.

4. The method according to claim 1 wherein adjusting the program voltage of the memory cells comprises adjusting the program voltage of multi-level memory cells.

5. The method according to claim 1 wherein the program voltage of the erasing phase is higher than the program voltage of the writing phase.

6. A memory structure comprising:

a memory array comprising a matrix of non-volatile memory cells organized in rows and columns;

a byte switch coupled to a first group of the non-volatile memory cells along one row of the matrix;

a bit switch coupled to a second group of the non-volatile memory cells along one column of the matrix;

a voltage generator;

a first voltage regulator coupled between an output of the voltage generator and the byte switch and structured to produce a first voltage at an output terminal; and a second voltage regulator coupled between a second output of the voltage generator and the bit switch and structured to produce a second voltage at an output terminal.

7. The memory structure of claim 6 wherein the memory array is structured to be an array of multi-level non-volatile memory cells.

8. The memory structure of claim 6 wherein the first voltage is applied to control gates of the first group of memory cells.

9. The memory structure of claim 6 wherein the second voltage is applied to drain terminals of the second group of memory cells.

10. A method of adjusting a program voltage in a semiconductor non-volatile memory that includes a matrix of memory cells each having a floating gate, a control gate, and drain and source terminals, the memory cells being organized by rows and columns, each row including a group of cells having their respective control gates connected in parallel with one another to a common control line, and each column including a group of cells having their respective drain terminals connected to a respective bit line, the method comprising:

receiving the program voltage at an input node, the program voltage having a first level;

producing a regulated write voltage from the program voltage, the write voltage having a second level;

applying the write voltage to the bit line of a selected one of the cells during a writing phase; and applying an erase voltage to the control line of the selected cell during an erasing phase, the erase voltage being a function of the program voltage and being independent of the write voltage and having a third level different from the second level of the write voltage.

11. The method according to claim 10, further comprising producing the erase voltage from the program voltage.

12. The method according to claim 11 wherein producing the write voltage is performed using a first voltage regulator having an output coupled to the bit line of the selected cell and wherein producing the erase voltage is performed using a second voltage regulator having an output coupled to the control line of the selected cell.

13. The method according to claim 10 wherein the erase voltage during the erasing phase has a duration, ramp rate, and signal amplitude independent of the write voltage during the writing phase.

14. The method according to claim 10 wherein the cells are multi-level cells.

15. The method according to claim 10 wherein the erase voltage is higher than the write voltage.

* * * * *